US006480001B2

(12) United States Patent
Frederick

(10) Patent No.: US 6,480,001 B2
(45) Date of Patent: Nov. 12, 2002

(54) REPAIR DEVICE FOR DECORATIVE LIGHT SHUNT

(75) Inventor: W. Richard Frederick, Mundelein, IL (US)

(73) Assignee: Integrated Power Components, Inc., Mundelein, IL (US)

( * ) Notice: Subject to any disclaimer, the term of this patent is extended or adjusted under 35 U.S.C. 154(b) by 0 days.

(21) Appl. No.: 10/059,750

(22) Filed: Jan. 28, 2002

(65) Prior Publication Data

US 2002/0135374 A1 Sep. 26, 2002

Related U.S. Application Data

(63) Continuation of application No. 10/041,032, filed on Dec. 28, 2001.
(60) Provisional application No. 60/277,481, filed on Mar. 20, 2001, and provisional application No. 60/289,865, filed on May 9, 2001.

(51) Int. Cl.$^7$ ......................... G01R 31/00; H01H 31/02; H01K 1/62
(52) U.S. Cl. ..................... 324/403; 324/406; 324/414; 324/556; 315/75
(58) Field of Search ................ 324/403, 406, 324/407, 412, 414, 512, 527, 550, 555, 556; 315/75

(56) References Cited

U.S. PATENT DOCUMENTS

| 3,063,006 | A | | 11/1962 | Steinberger | |
|---|---|---|---|---|---|
| 3,214,579 | A | | 10/1965 | Pacini | ........................ 240/10 |
| 3,749,975 | A | * | 7/1973 | Walters | ................ 315/227 R |
| 3,964,040 | A | | 6/1976 | Behl | ........................ 340/251 |
| 4,034,259 | A | | 7/1977 | Schoch | ........................ 315/93 |
| 4,233,543 | A | * | 11/1980 | Hickok | ....................... 313/315 |
| 4,340,841 | A | * | 7/1982 | Schupp | ....................... 313/315 |
| 4,425,605 | A | | 1/1984 | Cheng | ......................... 362/227 |
| 4,608,508 | A | | 8/1986 | Ohnishi | |
| 4,610,624 | A | * | 9/1986 | Bruhn | ......................... 431/255 |
| 4,727,449 | A | | 2/1988 | Fleck | ........................... 361/54 |
| 4,943,752 | A | * | 7/1990 | Todd et al. | ................. 310/339 |
| 5,008,626 | A | * | 4/1991 | Boyd, Sr. | .................... 324/133 |
| 5,032,961 | A | | 7/1991 | Pouyanne et al. | ........... 362/251 |
| 5,065,067 | A | | 11/1991 | Todd et al. | |
| 5,150,964 | A | | 9/1992 | Tsui | ............................ 362/251 |
| 5,179,339 | A | | 1/1993 | Volk, Jr. | |
| 5,262,697 | A | | 11/1993 | Meury | |
| 5,290,986 | A | | 3/1994 | Colon et al. | ................. 219/770 |
| 5,317,491 | A | | 5/1994 | Lee | ............................ 362/249 |
| 5,319,312 | A | | 6/1994 | Segilia | |
| 5,365,145 | A | | 11/1994 | Fields | ........................... 315/86 |
| 5,369,363 | A | | 11/1994 | Hey | |
| 5,453,664 | A | | 9/1995 | Harris | |
| 5,539,317 | A | | 7/1996 | Janning | |
| 5,604,436 | A | | 2/1997 | Henritzy et al. | |
| 5,676,250 | A | | 10/1997 | Walters | ....................... 206/419 |
| 5,745,410 | A | * | 4/1998 | Yiu et al. | ............... 365/185.11 |
| 5,975,717 | A | | 11/1999 | Rahman | ...................... 362/251 |
| 6,065,958 | A | | 5/2000 | Adams et al. | |
| 6,095,796 | A | | 8/2000 | Sung | |
| 6,095,799 | A | | 8/2000 | McDonough et al. | |
| 6,116,892 | A | | 9/2000 | Yang | |
| 6,344,716 | B1 | | 2/2002 | Gibboney, Jr. | ............... 315/185 |

* cited by examiner

Primary Examiner—N. Le
Assistant Examiner—Anjan K. Deb
(74) Attorney, Agent, or Firm—Jenkens & Gilchrist

(57) ABSTRACT

A repair device for fixing a malfunctioning shunt across a failed filament in a light bulb in a group of series-connected miniature decorative bulbs includes a piezoelectric pulse generator producing one or more pulses of a magnitude greater than the standard AC power line voltage. A connector receives the pulses from the pulse generator and supplies them to the group of series-connected miniature decorative bulbs.

11 Claims, 1 Drawing Sheet

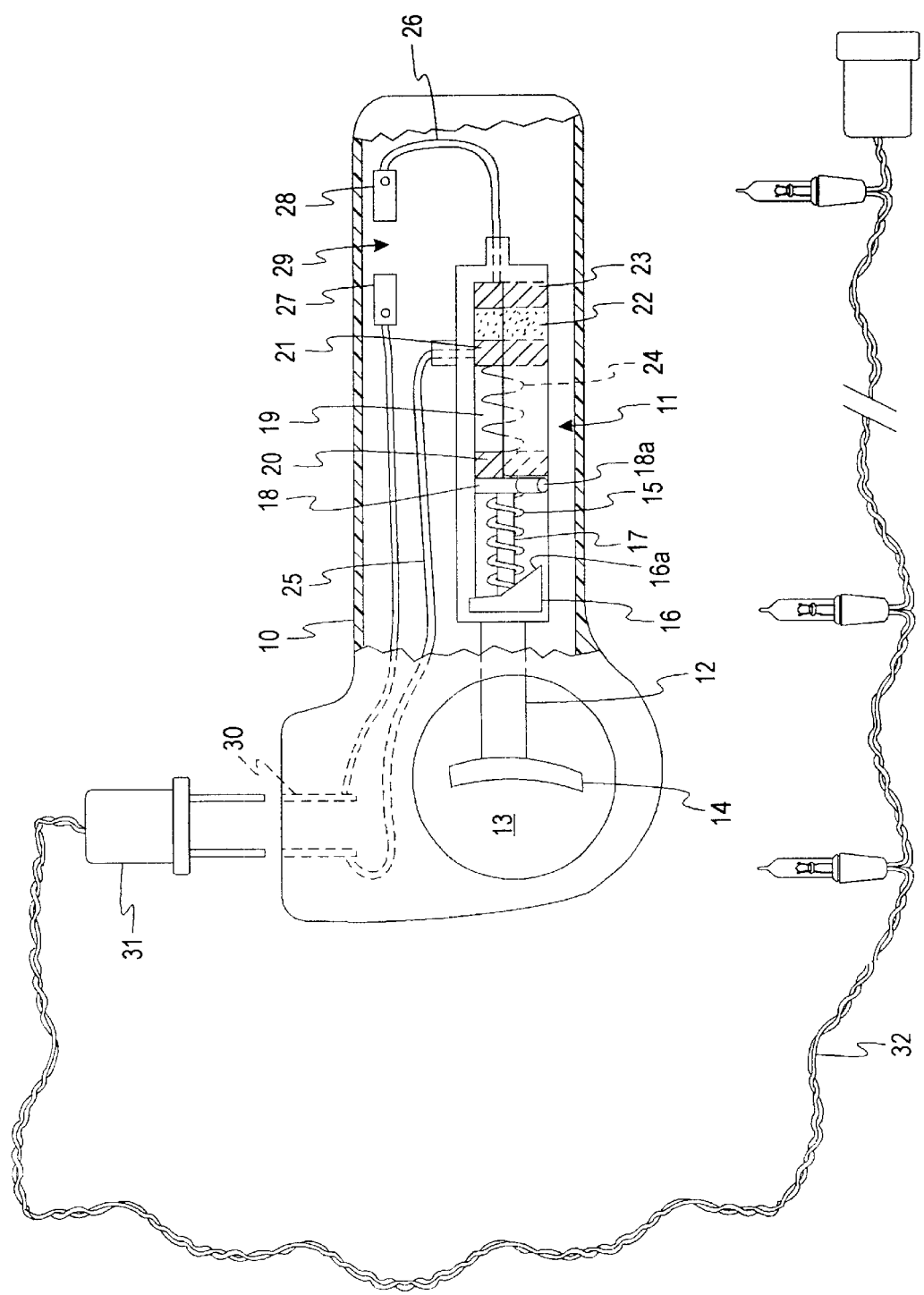

REPAIR DEVICE FOR DECORATIVE LIGHT SHUNT

CROSS-REFERENCE TO RELATED APPLICATIONS

This application claims priority to U.S. Provisional Application Serial No. 60/277,481 filed Mar. 20, 2001; to U.S. Provisional Application Serial No. 60/289,865 filed May 9, 2001; and is a continuation of U.S. application Ser. No. 10/041,032 filed Dec. 28, 2001.

FIELD OF THE INVENTION

The present invention relates to devices for repairing and testing decorative lights, including lights for Christmas trees, including pre-strung or "pre-lit" artificial trees.

BACKGROUND OF THE INVENTION

One of the most common uses of series-connected light strings, particularly of the commonly called "miniature" type, is for decoration and display purposes, particularly during Christmas time and other holidays. Such light strings are especially popular for the decoration of Christmas trees, both inside and outside commercial, industrial and residential buildings, trees and shrubbery, and the like.

Probably the most popular light set currently available on the U.S. market comprises one or more strings of 50 miniature light bulbs each. In Europe and other countries that have 240-volt power rather than 120 volts, strings of 100 lights are more common. Each bulb typically has an operating voltage of 2.5 volts, and the filaments of each 50-bulb string are connected in an electrical series circuit arrangement. If overall light sets of more than 50 bulbs are desired, the common practice is to provide a plurality of 50-bulb strings, with the bulbs in each string connected in electrical series, and with the plurality of strings being connected in a parallel circuit arrangement with respect to each other to form the light set.

As the bulbs in each string are connected in series, when a single bulb fails to illuminate for any reason, the whole string fails to light, and it is very frustrating and time consuming to locate and replace a defective bulb or bulbs. Usually many bulbs have to be checked in order to find the failed bulb. In fact, in many instances, the frustration and time-consuming efforts are so great as to cause one to completely discard and replace the string with a new string. Replacement, however, does not offer a practical solution if the lights are on an already decorated Christmas tree where removal could cause damage to the ornaments, or on wire frame yard decorations where the lights have many clips and wire ties holding them to the frame.

Light bulb manufacturers have also attempted to solve the problem of light section or string failures caused by single bulb failure by designing each light bulb in the string in a manner whereby the filament in each light bulb is shorted by a shunting device whenever it burns out for any reason, thereby preventing an open circuit condition from occurring in the socket of the burned-out bulb. However, in actual practice, it has been found that such short circuiting feature within the bulb does not always operate in the manner intended, resulting in the entire series section or string going out whenever a single bulb burns out.

The above-cited attempts to prevent string failure in series-circuit light strings have included the use of one or more shunt devices in association with each bulb and socket combination. The shunt is typically positioned directly within the glass envelope of each bulb in the string, making the effectiveness of the shunt depend on the presence at all times of a bulb within each of the bulb sockets in the string. In operation, the shunt provides an alternate path through which electric current will flow in the event of filament failure. After bulb failure and as long as the bulb remains in the string, the shunt allows current to continue to flow through the bulb, thereby preventing the failure of the entire series section of the light string.

The shunt is typically made at least in part of a material that is non-conductive as long as the bulb filament is operative, but becomes conductive whenever the filament fails. In normal operation, current will flow through the filament to produce incandescent light within the bulb envelope. When the filament breaks, however, the increased voltage differential across the bulb lead wires causes the non-conductive material to break down so that current continues to flow through the shunt in the failed bulb to the other bulbs in series therewith. That is, each shunt is inoperative unless and until it is subjected to substantially the full output voltage of the power source. When the bulb filament associated with a shunt fails, that shunt is subjected to the full voltage of the power supply, which renders that shunt operative to bypass the failed filament. A variety of different shunt structures and materials are well known in the industry, such as those described in U.S. Pat. Nos. 4,340,841 and 4,808,885.

In actual practice, the shunts described above do not function with a high degree of reliability, and thus the failure of a single bulb still often extinguishes the entire string.

SUMMARY OF THE INVENTION

In accordance with the present invention, there is provided a repair device for fixing a malfunctioning shunt in a decorative light string comprising series-connected miniature decorative bulbs, each bulb having a filament and a shunting device connected across the filament of the bulb for actuation by an increase in the voltage across the bulb when the filament fails. The repair device comprises a piezoelectric high-voltage pulse generator connected to the light string for supplying the string with electrical pulses of a magnitude greater than the standard AC power line voltage and containing sufficient energy to cause a malfunctioning shunting device to conduct.

BRIEF DESCRIPTION OF THE DRAWINGS

The invention may best be understood by reference to the following description taken in conjunction with the accompanying drawings, in which the single FIGURE is a schematic diagram of a string of decorative lights being plugged into a repair device embodying the present invention, with the repair device shown in side elevation with a portion of the housing broken away to show the internal structure, portions of which are also shown in section.

DETAILED DESCRIPTION OF THE PREFERRED EMBODIMENTS

Although the invention will be described in connection with certain preferred embodiments, it will be understood that the invention is not limited to those particular embodiments. On the contrary, the invention is intended to include all alternatives, modifications and equivalent arrangements as may be included within the spirit and scope of the invention as defined by the appended claims.

In the illustrative embodiment shown in the drawing, a portable, hand-held housing 10 contains a conventional piezoelectric device 11 capable of generating high-voltage pulses containing sufficient energy to cause a malfunctioning shunting device to conduct. The piezoelectric device 11 is actuated by a rod 12 that extends out of the housing 10 into a finger hole 13 where the rod 12 is attached to a trigger 14. When the trigger 14 is pulled, the rod 12 is retracted and retracts with it the left-hand end of a compression spring 15 and a cam element 16. The compression spring 15 is supported by a stationary rod 17 which telescopes inside the retracting rod 12 while the spring 15 is being compressed against a latch plate 18 at the right-hand end of the spring.

When the spring 15 is fully compressed, an angled camming surface 16a on the cam element 16 engages a pin 18a extending laterally from the latch plate 18, which is free to turn around the axis of the rod 17. The camming surface 16a turns the pin 18a until the pin reaches a longitudinal slot 19, at which point the compression spring 15 is released to rapidly advance a metal striker 20 against a striker cap 21 on one end of a piezoelectric crystal 22. The opposite end of the crystal 22 carries a second metal cap 23, and the force applied to the crystal 22 by the striker 20 produces a rapidly rising output voltage across the two metal caps 21 and 23. When the trigger 14 is released, a light return spring 24 returns the striker 20 and the latch plate 18 to their original positions, which in turn returns the cam element 16, the rod 12 and the trigger 14 to their original positions.

Although the piezoelectric device is illustrated in the drawing as containing a single crystal 22, it is preferred to use those commercially available devices that contain two stacked crystals. The striking mechanism in such devices strikes both crystals simultaneously, producing an output pulse that is the sum of the pulses produced by both crystals.

The metal caps 21, 23 are connected to a pair of conductors 25 and 26 leading to a socket 30 for receiving a plug 31 on the end of a light string 32. The conductor 26 may be interrupted by a pulse-triggering air gap 29 formed between a pair of electrodes 27 and 28, forming an air gap having a width from about 0.20 to about 0.25 inch. The voltage output from the piezoelectric crystal 22 builds up across the electrodes 27, 28 until the voltage causes an arc across the gap 29. The arcing produces a sharp voltage pulse at the socket 30 connected to the conductor 26, and in the light string 32 plugged into the socket 30. The trigger 14 is typically pulled several times (e.g., up to five times) to supply repetitive pulses to the light string.

Substantially the entire voltage of each pulse is applied to any inoperative shunt in a failed bulb in the light string, because the shunt in a failed bulb appears as an open circuit (or at least a very high impedance) in the light string. The light string is then unplugged from the socket 30 and plugged into a standard AC electrical outlet to render conductive a malfunctioning shunt not repaired by the pulses. It has been found that the combination of the high-voltage pulses and the subsequent application of sustained lower-voltage power (e.g., 110 volts) repairs a high percentage of failed bulbs with malfunctioning shunts. When a malfunctioning shunt is fixed, electrical current then flows through the failed bulb containing that shunt, causing all the bulbs in the light string except the failed bulb to become illuminated. The failed bulb can then be easily identified and replaced.

In cases where a hundred-light set comprises two fifty-light sections connected in parallel with each other, each applied pulse is divided between these two sections and may not have enough potential to activate a malfunctioning shunt in either section. In these cases, an additional and rather simple step is added. First, any bulb from the working section of lights is removed from its base. This extinguishes the lights in the working section and isolates this working section from the one with the bad bulb. Next, the string of series-connected bulbs is plugged into the socket of the repair device, and the trigger-pulling procedure is repeated. The lights are then unplugged from the repair device, the removed bulb is re-installed, and the light set is re-plugged into its usual power source. Since the shunt in the bad bulb is now operative, all the lights except the burned out one(s) will come on.

When a bulb does not illuminate because of a bad connection in the base of the bulb, the pulse from the piezoelectric element will not fix/clear this type of problem. Bad connections in the base and other miscellaneous problems usually account for less than 20% of the overall failures of light strings.

What is claimed is:

1. The combination of (1) a decorative light string comprising series-connected miniature decorative bulbs, each bulb having a filament and a shunting device connected across the filament of the bulb for actuation by an increase in the voltage across the bulb when the filament fails, and (2) a repair device for fixing a malfunctioning shunting device across a failed filament in one of said bulbs, said repair device comprising a piezoelectric high-voltage pulse generator connected to said light string for supplying said string with electrical pulses of a magnitude greater than the standard AC power line voltage and containing sufficient energy to cause a malfunctioning shunting device to conduct.

2. The repair device of claim 1 which includes a spark gap between said high-voltage pulse generator and said connector for shaping a pulse from said generator before said pulse is applied to a light string connected to said connector.

3. The repair device of claim 1 which includes a portable housing containing said high-voltage pulse generator and connector.

4. A method of fixing a malfunctioning shunting device across a failed filament in a bulb in a decorative light string comprising series-connected miniature decorative bulbs, each bulb having a filament and a shunting device connected across the filament of the bulb for actuation by an increase in the voltage across the bulb when the filament fails, said method comprising connecting a piezoelectric high-voltage pulse generator to said light string, and actuating said generator to supply said light string with electrical pulses of a magnitude greater than the standard AC power line voltage and containing sufficient energy to cause the malfunctioning shunting device to conduct.

5. The method of claim 4 wherein said high-voltage pulse is shaped before it is applied to said light string.

6. The method of claim 4 wherein a generated voltage is allowed to build up to a preselected level before the pulse is applied to said light string.

7. A device for initiating the operation of a shunt connected in parallel with a failed filament of a light bulb in a group of series-connected bulbs, said device comprising:

a piezoelectric element and means for striking said element to produce a voltage pulse; and means for applying said voltage pulse to said group of series-connected bulbs to cause said shunt material to become conductive in any bulb having a burned-out filament.

8. The device of claim 7 which includes a housing member containing said piezoelectric element, and connecting means including a socket in a wall of said housing for receiving a plug on said string of series-connected bulbs.

9. The device of claim 7 wherein said striking means includes a movable spring-loaded trigger and an anvil connected to said trigger for striking said piezoelectric element to produce said voltage pulse.

10. A method of initiating the operation of a shunt connected in parallel with a failed filament of a light bulb in a group of series-connected bulbs, said method comprising:

proviureding a piezoelectric source of high voltage in excess of ordinary power line voltage at limited current; and connecting said high voltage source in series with said series-connected bulbs to apply a voltage to said series-connected bulbs.

11. A device for initiating the operation of a shunt connected in parallel with the filament of a light bulb in a group of series-connected bulbs, said shunt including a pair of wires separated only by a non-conductive coating that is intended to be eliminated in response to a failure of the filament connected in parallel therewith, said device comprising:

a piezoelectric source for applying a high-voltage pulse to said group of series-connected bulbs to cause said shunt to become conductive in any bulb having a burned-out filament.

* * * * *